United States Patent [19]

Yen

[11] Patent Number: 4,735,680

[45] Date of Patent: Apr. 5, 1988

[54] METHOD FOR THE SELF-ALIGNED SILICIDE FORMATION IN IC FABRICATION

[76] Inventor: Yung-Chau Yen, 1077 Topaz Ave., #14, San Jose, Calif. 95117

[21] Appl. No.: 931,141

[22] Filed: Nov. 17, 1986

[51] Int. Cl.[4] .................. H01L 21/306; B44C 1/22; C03C 15/00; C23F 1/02
[52] U.S. Cl. .................................. 156/643; 156/646; 156/648; 156/653; 156/656; 156/657; 156/659.1; 156/662; 357/23.1; 357/41; 357/67; 437/41; 437/200; 437/228

[58] Field of Search ............... 156/643, 646, 648, 653, 156/656, 657, 659.1, 661.1, 662, 668; 427/88, 89, 399; 430/313, 317; 357/23.1, 23.9, 41, 42, 43, 44, 49, 65, 67, 71; 29/571, 576 W, 578; 437/40–45, 56, 57, 58, 59, 192, 200, 228, 235, 238, 241

[56] References Cited

U.S. PATENT DOCUMENTS

| 4,521,952 | 6/1985 | Riseman | 29/571 X |
| 4,528,744 | 7/1985 | Shibata | 29/571 |
| 4,577,392 | 3/1986 | Peterson | 28/571 |

*Primary Examiner*—William A. Powell

[57] ABSTRACT

The invention discloses an improved process to form a silicide layer on an integrated circuit structure. The conventional lateral silicide growth is prevented by employing a slot configuration which is formed with the self-aligned process. It is simple to construct a multi-level interconnect scheme with the practice of the invention.

20 Claims, 1 Drawing Sheet

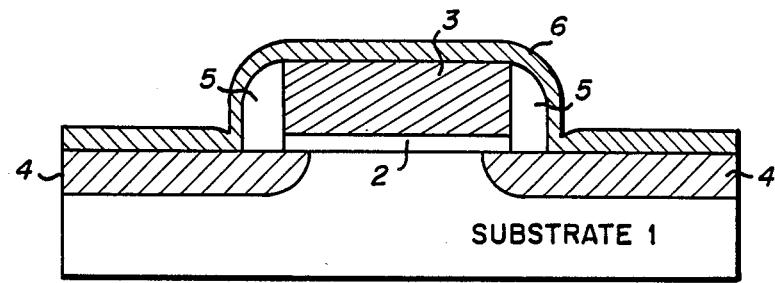
Fig_1 (PRIOR ART)
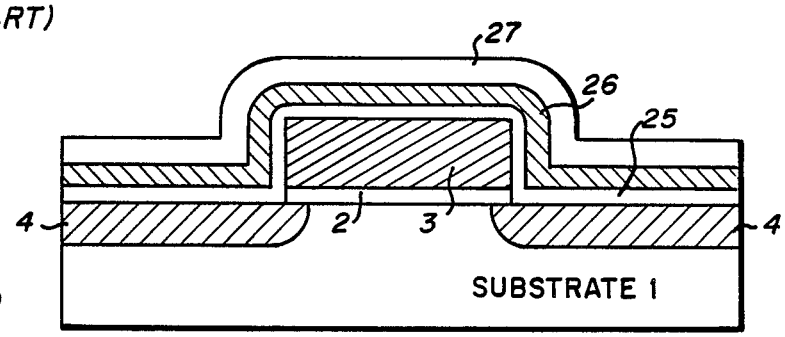
Fig_2
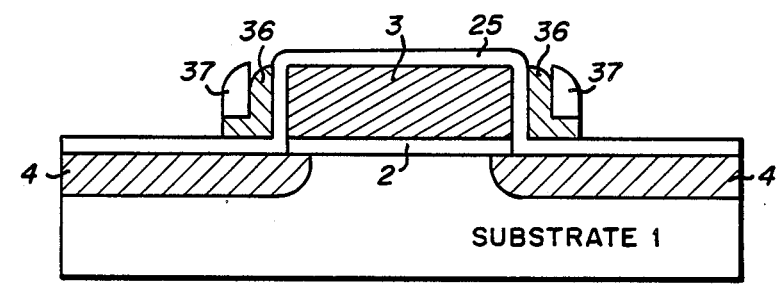
Fig_3
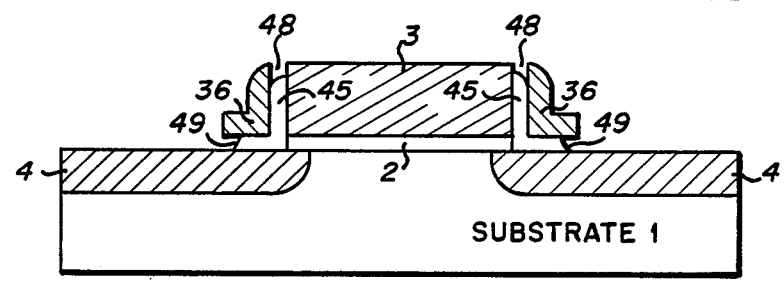
Fig_4
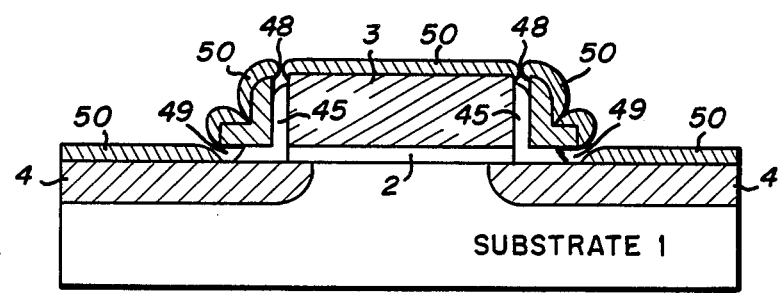
Fig_5
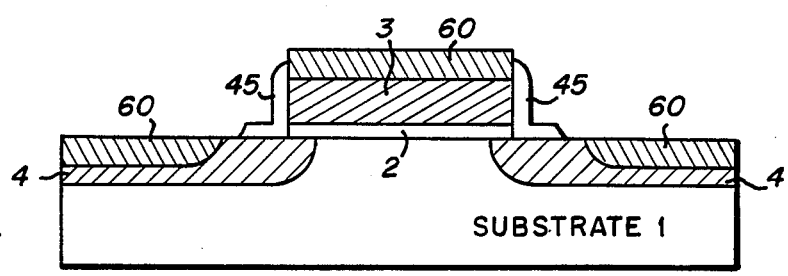
Fig_6

METHOD FOR THE SELF-ALIGNED SILICIDE FORMATION IN IC FABRICATION

BACKGROUND OF THE INVENTION

1. Field of the Invention

This invention relates to wafer processing in the integrated circuit fabrication. More particularly, this invention relates to an improved method to form self-aligned silicide layers on an integrated circuit structure.

2. Description of the Prior Art

In today's integrated circuit fabrication, heavily doped diffusion strips (N+ source and drain" hereafter called S/D" in NMOS process and P+ S/D in PMOS process) and heavily doped polycrystalline silicon (hereafter called poly) lines are used for the electrical interconnections. With the continuously scaling down dimensions of semiconductor devices, the S/D resistance of the transistor and the poly-line resistance become more critical for the better performance of devices in integrated circuits. One method to reduce the resistance is to form silicide layers on S/D areas and on poly lines. The simplest technique was to form self-aligned silicide layers right after the formation of S/D junctions. But this method easily resulted in the electrical short between S/D and the polygate of the transistor. In order to prevent the electrical short, oxide spacers 5 were employed as shown in FIG. 1. After the formation of N+ S/D 4 junctions by employing implantation method with the use of the poly-gate 3 on the gate-oxide 2 as implant mask (P-type substrate 1 was used as an example for NMOS process), CVD (Chemical Vapour Deposition) oxide was deposited and anisotropically etched to form oxide spacers 5 on sidewalls of the poly-gate 3. The anisotropical oxide etch could be achieved with the dry etch technique which was commonly employed in the contact via etch the integrated circuits fabrication. Then, the transition metal layer 6 was sputter-deposited to the desired thickness. The transition metal can be selected from the group of Ti, W, Mo, Pt, Pd, Ni, or Ta etc., depending on the requirements of the process. After the sputter of the transition metal layer 6, silicide was formed by annealing at elevated temperature in a fuenace tube so that silicon and transition metal could react wherever they had intimate contact until total transition metal on silicon surfaces of S/D 4 and Poly-gate 3 had reacted with silicon to form silicide layer (not shown in FIG. 1). After the silicide formation, the unreacted transition metal was selectively etched (not shown in FIG. 1), for example, with the solution consisting of NH4OH, H2O2, and H2O. This technique suffers several drawbacks. For example, silicide can be formed on the surface of the oxide spacer 5 because of the lateral silicide growth. Also transition metal like Ti can react with oxide to form TiO2 which can not be selectively removed. In order to overcome these difficulties, the two-step anneal process was developed (for example see "novel submicrometer MOS devices by self-aligned nitridation of cilicide" by Haneko et al, IEEE Tran. Elec. Dev., ED-33, p. 1702, 1986). In this process, silicide was first formed at relatively low temperature in the furnace tube (just high enough to stimulate the reaction between silicon and transition metal) after the sputtered deposition of the transition metal layer 6. At this low temperature, there is little reaction between transition metal and oxide. Then, the selective etch was carried out to removed the unreacted transition metal on surfaces of oxide spacers 5. Finally, high temperature anneal step was carried out in the furnace tube to achieve the final low value of the resistance. This two-step anneal process still suffers many difficulties including (1) Although the lateral silicide growth is reduced, it is not eliminated. The lateral silicide growth is determined by the first low temperature anneal step. Therefore, this low temperature anneal step is very critical, (2) It is difficult to form silicide layer with varying thicknesses. Since it is required that poly interconnect line have thicker silicide layer to lower the resistance, while it is required that the transistor's source and drain have thinner silicide layer in order not to penetrate the shallow S/D junctions, (3) Because of the lateral silicide growth, the pre-patterned poly lines will change dimensions when the thicker silicide layer is formed to achieve lower resistance. This invention will teach a technique to overcome these difficulties and provide a simple and less critical process to form self-aligned silicide layers.

SUMMARY OF THE INVENTION

It has been discovered that the lateral silicide growth can be eliminated by employing slots to interrupt the continuity of the sputtered transition metal layer on the integrated circuit structure. Therefore, it is an object of the invention to provide an improved method for the self-aligned silicide formation with the use of slots in integrated circuits fabrication.

It is another object of the invention to provide an improved method for the self-aligned silicide formation without the lateral silicide growth. It is a further object of the invention to provide an improved method for the self-aligned silicide formation without the dimensional change of the pre-patterned poly lines.

It is a yet further object of the invention to provide an improved method for the self-aligned silicide formation with varying thicknesses of silicide layers in the integrated circuit structure. It is another further object of the invention to provide an improved method for the self-aligned silicide formation to form multilevel silicide interconnect lines.

BRIEF DESCRIPTION OF THE DRAWINGS

All figures are for the illustrations and descriptions of the spirits of the invention and do not have the exact dimensions and shapes.

FIG. 1 is a vertical cross-section view of an integrated circuit structure illustrating the prior art of the silicide formation method.

FIGS. 2–6 are vertical cross-section views of the transistor portions in an integrated circuit structure after different process steps in the practice of the invention.

FIG. 2 illustrates a cross-section view of the structure after the depositions of different dielectric layers.

FIG. 3 illustrates a cross-section view of the structure after the spacer formation.

FIG. 4 illustrates a cross-section view of the structure after the slot formation.

FIG. 5 illustrates a cross-section view of the structure after the sputter of the transition metal layer.

FIG. 6 illustrates a cross-section view of the structure after the removal of the unreacted transition metal.

DETAILED DESCRIPTION OF THE INVENTION

The invention provides an improved method for the self-aligned silicide formation in an integrated circuit structure requiring low S/D and poly-line resistances to provide better device performances. In accordance with the invention, thin oxide (i.e. silicon dioxide) layer 25 (for example 15 nm) is grown after N+ S/D 4 junctions formation with implant technique as shown in FIG. 2.P-type substrate 1 is used for NMOS as an example. A thicker silicon nitride (hereafter called nitride) layer 26 (for example 50 nm) is deposited with CVD method, followed by the deposition of CVD oxide layer 27 (for example 100 nm). The CVD oxide layer 27 thickness is not critical. Any commonly used method in the current integrated circuit fabrication can be employed to obtain these three layers. The CVD oxide layer 27 is then anisotropically etched (for example with the current contact via etch method) to form oxide spacers 37 on sidewalls of nitride layer 26, followed by the etch of nitride layer 26 to form nitride spacers 36 on sidewalls of the thin oxide layer 25 as shown in FIG. 3. The etch of nitride layer 26 can be either with wet chemicals (for example the hot H3PO4 solution) or with the dry etch method (for example isotropical etch with CF4/O2 plasma etch, or anisotropical etch with CHF3 gas in RIE:Reactive Ion Etch). FIG. 3 shows the anisotropical etch of the nitride layer 26. Now, the thin oxide layer 25 is isotropically etched (for example with 10:1 HF solution) to form vertical slots 48 on sidewalls of the poly-gate 3 and horizontal slots 49 on surfaces of S/D as shown in FIG. 4. The thin oxide etch result in the thin oxide segments 45 which protect the good quality gate oxide 2. Because the thin oxide layer 25 is relatively very thin, slots 48 and 49 have very high aspect ratio (slot height to slot width). Also note that oxide spacers 37 are removed after the etch of the thin oxide layer 25 as shown in FIG. 4, because CVD oxide is etched faster than thermally grown thin oxide in 10:1 HF solution. After the formation of slots 48 and 49, the transition metal layer 50 is sputtered to the desired thickness without the substrate heat and the substrate voltage bias. This is shown in FIG. 5. The poor step coverage is a well-known phenomenon in the metal sputter on the corrugated surface. The continuity of the transition metal layer 50 is interrupted at locations of slots 48 and 49 as shown in FIG. 5. Therefore, when the anneal step is carried out at elevated temperature in the furnace tube to form silicide, there is no lateral silicide growth. Also because of slots 48 and 49, the anneal step can be carried out in the vacuum chamber at the same time during the sputter of the transition metal layer 50 The anneal time becomes non-critical. If oxide spacers 36' are used as described in EMBODIMENT II, the two-step anneal process can be employed to prevent the reaction between oxide and transition metal. Also, the first low temperature anneal step can be carried out in the vacuum chamber during the sputter of the transition metal layer 50. After the formation of the silicide layer 60 as shown in FIG. 6, the unreacted transition metal on nitride spacers 36 can be removed with the selective etch as mentioned above. If nitride spacers 36 are not desirable, it can be etched with hot H3PO4 solution. For a case that silicide layer 60 can be etched with hot H3PO4 solution, then, thin oxide layer can be thermally grown on silicide layer 60 at low temperature. (preferred below 900 degree Celsius) This thin oxide layer serves as a protective layer for silicide layer 60 during nitride spacers 36 etch with hot H3PO4 solution. FIG. 6 shows the structure without nitride spacers 36.

EMBODIMENT I

Alternatively, slot 48 and slot 49 can be formed with the method described below. As shown in FIG. 2, CVD oxide layer 27 is omitted. Only thin oxide layer 25 and nitride layer 26 are employed. Now, the nitride layer 26 is anisotropically etched (for example with RIE) to form nitride spacers 36. The thin oxide layer 25 is then isotropically etched (for example with 10:1 HF solution) for the desired time to form slot 48 and slot 49 as shown in FIG. 4.

EMBODIMENT II

Another alternative can be described in this embodiment to form slot 48 and 49. Now with the patterned poly-gate 3 on gate oxide 2 as implant mask, N+ S/D 4 junctions are formed as shown in FIG. 2, thin nitride layer 25' (instead of thin oxide layer 25) is formed either with thermally grown thin nitride layer 25' (instead of thin oxide layer 26' (instead of nitride layer 26 in the above description) is deposited, the cvd oxide layer 27 is combined into CVD oxide layer 26' in this case. The CVD oxide layer 26' is then anisotropically etched to form oxide spacers 36' (instead of nitride spacers 36 in FIG. 3) on sidewalls of the nitride layer 25'. The thin nitride layer 25' is isotropically etched with wet chemicals (for example, the hot H3PO4 solution) for the desired time to form vertical slots 48 and horizontal slots 49 as shown in FIG. 4.

EMBODIMENT III

It is always desirable to have lower interconnect resistance, therefore, the thicker silicide layer on poly lines is needed. On the other hand, the thinner silicide layer is needed on S/D areas because the shallow junctions can be penetrated by the thicker silicide layer formation. Consequently, different thicknesses of silicide layers are required in the integrated circuit structure. This embodiment will describe the simple method to form varying thicknesses in the integrated circuit structure with the practice of the invention. After the formation of dielectric layers 25,26 and 27 as shown in FIG. 2, the photoresist is spun and developed such that the portion of poly lines in the integrated circuit structure (not shown in FIG. 2) is uncovered, while the transistor portion (as shown in FIG. 2) is covered with the photoresist. After develop, slots 48 and 49 can be formed with any one of methods described in accordance with the description of FIG. 3 and 4. Then, the photoresist is stripped off. The process steps described in FIG. 5 and 6 are carried out to form the silicide layer with the desired thickness on poly lines. After the silicide formation on poly lines, the photoresist is spun and developed to cover the portion of poly interconnect lines in the integrated circuit structure, while the transistor portion is uncovered. The process steps described in FIG. 3 and 4 are carried out to form slots 48 and 49 as shown in FIG. 4. Then, the photoresist is stripped off. The process steps described in FIG. 5 and 6 are carried out to form the silicide layer with the desired thickness on S/D areas. Note that silicide is also formed on poly lines in addition to the previously formed silicide layer.

EMBODIMENT IV

The invention is applicable to fabricate multilevel interconnects with silicide-on-poly lines. After the practice of the invention to form the first layer silicide in accordance with the above description, the insulating layer (for example CVD oxide) is formed, followed by the LPCVD poly deposition. The poly layer is heavily doped and patterned in according to the desired dimensions. The process steps described above from FIG. 2-6 can be carried out to form the second silicide layer with the desired thickness on poly lines. The process can be repeated as desired for the next layer and on to construct the multilevel interconnect scheme.

CONCLUSIONS

The foregoing description of the invention has been presented for purposes of illustration and description. It is not intended to be exhaustive, or to limit the invention to the precise form disclosed. Obviously, many modifications and variations will be apparent to practitioners skilled in the art. For example, additional layers can be added to the above mentioned three-dielectric-layer system in FIG. 2 to form slots 48 and 49 as shown in FIG. 4. It is possible that the invention may be practiced in other technologies in MOS or Bipolar processes. Similarly, any process steps described might be interchangable with other steps in order to achieve the same result.

What is claimed is:

1. An improved method for forming a self-aligned silicide layer on an integrated circuit structure by employing a slot configuration which is fabricated with the following steps:
    (a) forming first thin dielectric layer after the formation of S/D junctions in said integrated circuit structure;
    (b) forming second dielectric layer on said first thin dielectric layer;
    (c) forming third dielectric layer on said second dielectric layer;
    (d) anisotropically and selectively etching said third dielectric layer to form spacers on sidewalls of said second dielectric layer;
    (e) selectively etching said second dielectric layer to form another spacers on sidewalls of said first thin dielectric layer;
    (f) selectively and isotropically etching said first thin dielectric layer to form vertical slots on sidewalls of poly lines and horizontal slots on S/D surfaces;
    (g) forming a metal layer on said integrated circuit structure;
    (h) forming silicide layers by annealing said integrated circuit structure at an elvated temperature;
    (i) selectively etching off unreacted portion of said metal layer.

2. The method of claim 1 wherein said first thin dielectric layer is silicon dioxide, said second dielectric layer is silicon nitride, and said third dielectric layer is silicon dioxide.

3. The method of claim 1 wherein said first thin dielectric layer is silicon dioxide, said second dielectric layer is silicon nitride, and said third dielectric layer is omitted.

4. The method of claim 3 wherein said second dielectric layer is anisotropically and selectively etched.

5. The method of claim 1 wherein said first thin dielectric layer is silicon nitride, said second dielectric layer is silicon dioxide, and said third dielectric layer is silicon nitride.

6. The method of claim 1 wherein said first thin dielectric layer is silicon nitride, said second dielectric layer is silicon dioxide, and said third dielectric layer is omitted.

7. The method of claim 6 wherein said second dielectric layer is anisotropically and selectively etched.

8. The method of claim 1 wherein said second dielectric layer has different material compositions and etch characteristics from both said first thin dielectric layer and said third dielectric layer which are allowed to be the same materials.

9. The method of claim 1 wherein said slots have high aspect ratio great than 1.

10. The method of claim 1 wherein said first thin dielectric layer, said second dielectric layer, and said third dielectric layer are repeatedly formed to construct multiple said slots.

11. The method of claim 1 wherein said forming a metal layer is achieved with the sputtering technique, with the chemical vapor deposition, and with the evaporation technique.

12. The method of claim 1 wherein said annealing is carried out in the sputter vacuum chamber during the sputter of said metal layer by heating said integrated circuit structure to stimulate the reaction between silicon and said metal layer.

13. The method of claim 1 wherein said annealing is carried out with the two-step process which comprises the steps of:
    (a) forming said silicide layer at low temperature in said sputter vacuum chamber during the sputter of said metal layer;
    (b) selectively etching off unreached portion of said metal layer;
    (c) heating said integrated circuit structure to high temperature.

14. The method of claim 13 wherein said low temperature is below the reaction temperature between said silicon dioxide and said metal layer, and said high temperature is typically at temperature to achieve the low resistance of said silicide layer.

15. The method of claim 1 wherein said silicide layer is repeatedly formed on said poly lines on an insulating dielectric layer to construct multilayer interconnects with the technique as set forth therein.

16. The method of claim 1 wherein said silicide layers are formed with the thicker thickness on said poly lines by first forming said vertical slots with the use of the photoresist to cover said S/D surfaces, followed by forming thinner said silicide layer on said S/D surfaces with the help of the photoresist to cover said poly lines to form said horizontal slots on said S/D surfaces.

17. The method of claim 1 wherein said silicide layer having thicker thickness on said poly lines and thinner thickness on said S/D surfaces are formed with the process comprising the steps of:
    (a) silicon nitride deposition on doped poly layer in said integrated circuit structure;
    (b) forming said poly lines by etching said silicon nitride and said poly layer;
    (c) oxidizing said integrated circuit structure at elvated temperature;
    (d) another silicon nitride layer deposition;
    (e) forming silicon dioxide layer on said another silicon nitride layer;
    (f) anisotropically etching said silicon dioxide layer;

(g) selectively etching said another silicon nitride layer and said silicon nitride;

(h) forming a thicker metal layer on said integrated circuit structure;

(i) forming a thicker silicide layer by heating said integrated circuit structure;

(j) selectively etching off unreacted portion of said thicker metal layer;

(k) selectively etching off said silicon dioxide on said S/D surfaces;

(l) forming second thinner metal layer on said integrated circuit structure;

(m) forming thinner silicide layer by heating said integrated circuit structure;

(n) selectively etching off unreacted portion of said second thinner metal layer;

18. The method of claim 16 wherein said thicker thickness of said silicide layer is formed on the desired locations of said S/D surfaces for the purpose of the electrical ground connect of said integrated circuit structure.

19. The method of claim 17 wherein said thicker thickness of said silicide layer is formed on the desired locations of said S/D surfaces for the purpose of the electrical ground connection of said integrated circuit structure.

20. The method of claim 1 wherein said metal layer is discontinued by forming said vertical slots and said horizontal slots.

* * * * *